(12) United States Patent
Tsunoda et al.

(10) Patent No.: US 7,786,013 B2
(45) Date of Patent: Aug. 31, 2010

(54) METHOD OF FABRICATING SEMICONDUCTOR DEVICE

(75) Inventors: Hiroaki Tsunoda, Kanagawa (JP); Masahisa Sonoda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/868,164

(22) Filed: Oct. 5, 2007

(65) Prior Publication Data
US 2008/0090378 A1 Apr. 17, 2008

(30) Foreign Application Priority Data
Oct. 6, 2006 (JP) ............................. 2006-275371

(51) Int. Cl.
*H01L 21/311* (2006.01)
(52) U.S. Cl. ...................... 438/696; 438/700; 438/702; 438/704; 257/E21.224; 257/E21.227; 257/E21.229
(58) Field of Classification Search ................ 438/694, 438/696, 695, 702, 425, 700, 701, 704, 717, 438/259, 296, 221; 134/36; 257/E21.229, 257/E21.224, E21.227
See application file for complete search history.

(56) References Cited

U.S. PATENT DOCUMENTS 6,124,206 A * 9/2000 Flietner et al. .............. 438/692
6,589,877 B1 * 7/2003 Thakur ........................ 438/703
6,620,681 B1 * 9/2003 Kim et al. .................... 438/257
7,125,783 B2 * 10/2006 Lo et al. ...................... 438/424
2003/0119260 A1 * 6/2003 Kim et al. .................... 438/257
2003/0181048 A1 * 9/2003 Huang et al. ................. 438/694
2007/0111467 A1 * 5/2007 Kim ............................ 438/424

FOREIGN PATENT DOCUMENTS

JP 2004-111547 4/2004

OTHER PUBLICATIONS

Ghandhi, S.K., VLSI Fabrication Principles, Silicon and Gallium Arsenide, 1983 by John Wiley and Sons, Inc, pp. 517-519.*

* cited by examiner

*Primary Examiner*—Julio J Maldonado
(74) *Attorney, Agent, or Firm*—Oblon, Spivak, McClelland, Maier & Neustadt, L.L.P.

(57) ABSTRACT

The present invention relates to methods of fabricating semiconductor devices, including forming a trench in a semiconductor substrate by a reactive ion etching (RIE) method with a reactive product of film stack of a carbon film/silicon oxide film/carbon-containing silicon oxide film, the trench having an inner surface; and removing the reactive product, by treating the trench with diluted hydrofluoric acid to remove the carbon film and the silicon oxide film followed by treating the film by a hydrofluoric acid vapor phase cleaning (HFVPC) method to remove the carbon-containing silicon oxide film.

16 Claims, 16 Drawing Sheets

METHOD OF FABRICATING SEMICONDUCTOR DEVICE

CROSS-REFERENCE TO RELATED APPLICATIONS

This application is based on and claims the benefit of priority from the prior Japanese Patent Application No. 2006-275371, filed on Oct. 6, 2006, the entire contents of which are incorporated herein by reference.

BACKGROUND OF THE INVENTION

1. Field of the Invention

The present invention relates to a method of fabricating a semiconductor device, in which a gate insulating film and a gate electrode layer are formed on a semiconductor substrate and thereafter, a trench is formed and an insulating film is buried in the trench.

2. Description of the Related Art

In semiconductor devices such as flash memories, an element isolation region for isolating adjacent element regions from each other has been narrowed with recent development in refinement of elements. For example, Japanese publication, JP-A-2004-111547, discloses a semiconductor device in which an element isolation region with a shallow trench isolation (STI) structure is formed in a surface layer of a semiconductor substrate to zone an element region.

According to a fabricating method disclosed in JP-A-2004-111547, a gate insulating film is formed on a semiconductor substrate, and a polycrystalline silicon film is formed on the gate insulating film. A silicon nitride film and a silicon oxide film are further deposited on the polycrystalline silicon film in turn. A resist is formed on the silicon oxide film into a desired pattern. The silicon oxide film is then processed with the patterned resist serving as a mask, and the resist is removed. Subsequently, a trench is formed in the silicon nitride film, polycrystalline silicon film, gate insulating film and an upper surface of the substrate by a reactive ion etching (RIE) method with the silicon oxide film serving as a mask.

However, the above-described method results in reaction products in sidewalls and bottom of the trench. In the above-noted Japanese publication, the reaction product is removed while bird beak tending to be produced in the gate insulating film is suppressed. Accordingly, vapor phase cleaning (VPC) is carried out at 80° C., instead of a conventional thermal oxidation process, so that the reaction product is removed. The above-noted Japanese publication discloses an acid treatment to be carried out subsequent to a dilute hydrofluoric acid treatment as the method of removing reaction products while bird beak is suppressed. However, the disclosed method has been found to be insufficient in removal of reaction products.

BRIEF SUMMARY OF THE INVENTION

Therefore, an object of the present invention is to provide a method of fabricating a semiconductor device in which reaction products due to the forming of a trench in the semiconductor substrate by the RIE method can be removed without use of a thermal oxidation process.

The present invention provides a method of fabricating a semiconductor device, comprising forming a trench in a semiconductor substrate by a reactive ion etching (RIE) method, the trench having an inner surface, treating the trench with diluted hydrofluoric acid, treating the trench by a hydrofluoric acid vapor phase cleaning (HFVPC) method, forming a high temperature oxide (HTO) film along the inner surface of the trench, and forming an element isolation insulating film inside the HTO film in the trench so that the trench is filled with the element isolation insulating film.

The invention also provides a method of fabricating a semiconductor device, comprising forming a gate insulating film on a semiconductor substrate, forming a gate electrode layer on the gate insulating film, forming a trench in the gate electrode layer, the gate insulating film and the semiconductor substrate, treating the trench with diluted hydrofluoric acid, treating the trench by a hydrofluoric acid vapor phase cleaning (HFVPC) method, and forming an element isolation insulating film in the trench.

The invention further provides a method of fabricating a semiconductor device, comprising forming a trench in a semiconductor substrate by a reactive ion etching (RIE) method with a reactive product of film stack of a carbon film/silicon oxide film/carbon-containing silicon oxide film, the trench having an inner surface, and removing the reactive product, by treating the trench with diluted hydrofluoric acid to remove the carbon film and the silicon oxide film followed by treating the film by a hydrofluoric acid vapor phase cleaning (HFVPC) method to remove the carbon-containing silicon oxide film.

BRIEF DESCRIPTION OF THE DRAWINGS

Other objects, features and advantages of the present invention will become clear upon reviewing the following description of one embodiment with reference to the accompanying drawings, in which.

DETAILED DESCRIPTION OF THE INVENTION

One embodiment of the present invention will be described with reference to the accompanying drawings. The invention is applied to fabrication of a memory cell region in a NAND flash memory in the embodiment. Identical or similar parts are labeled by the same reference symbols throughout the figures. It is noted that the figures illustrate frame formats of the device and the relationship between a thickness and planar dimension, thickness ratio of each layer and the like differ from those of actually fabricated devices.

Figure 1:
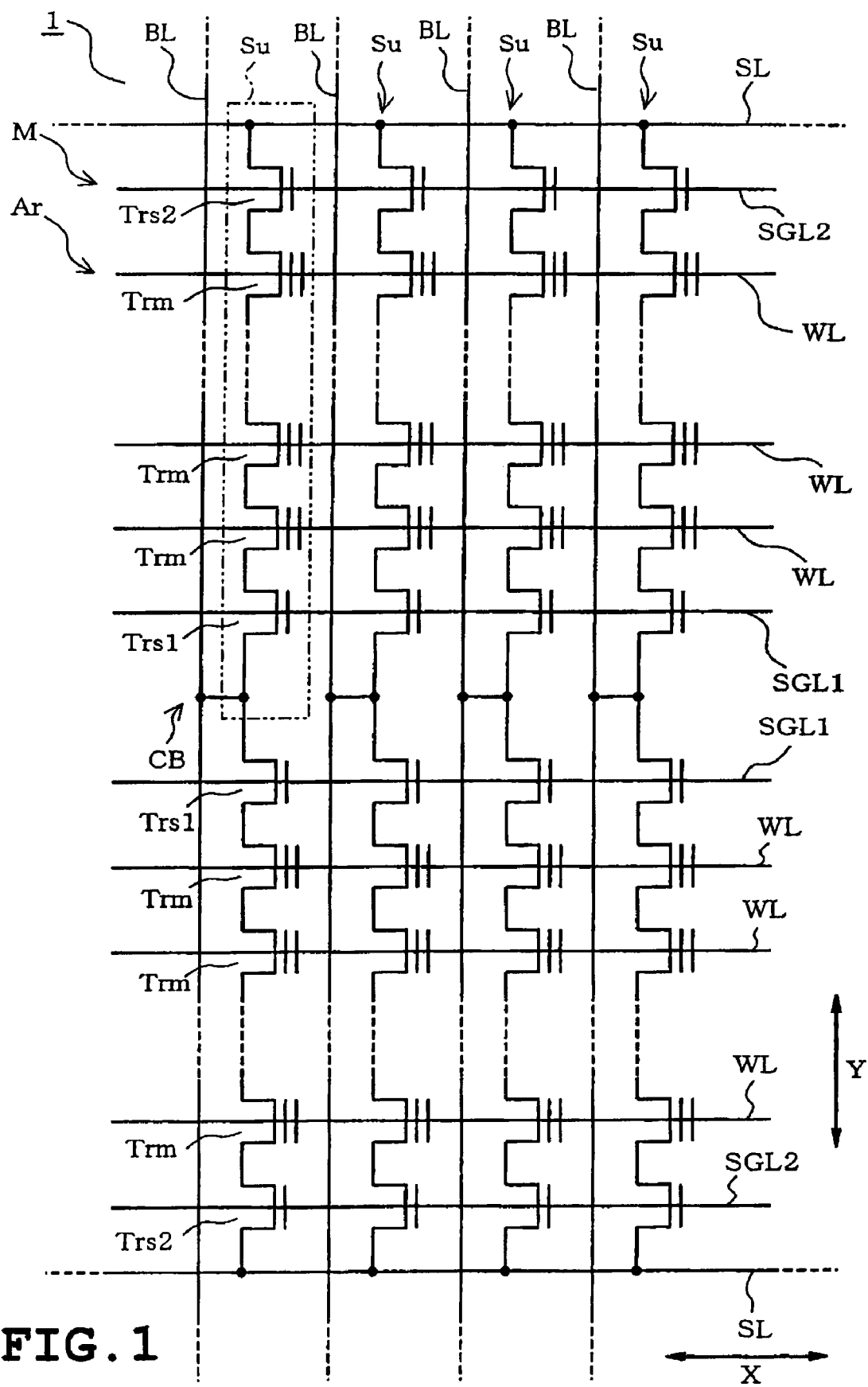
FIG. 1 shows an electrical arrangement of a memory cell region of a semiconductor device in accordance with one embodiment of the present invention.

FIG. 1 is a circuit schematic equivalent to a part of memory cell array composed in a memory cell region of the NAND flash memory. The NAND flash memory 1 includes a memory cell region M in which a memory cell array Ar is configured as shown in FIG. 1. The memory cell array Ar comprises NAND cell units SU formed in a matrix. Each unit SU includes two selective gate transistors Trs1 and Trs2 and a plurality of memory cell transistors (for example, 8 or $2^n$ where n is a positive integer) series connected between the selective gate transistors. In each NAND cell unit SU, the memory cell transistors Trm are formed by using a source/drain region (not shown) in common between the adjacent memory cell transistors Trm.

The memory cell transistors Trm arranged in the X direction (in the direction of a word line) in FIG. 1 are commonly connected by a word line (control gate line) WL. The selective gate transistors Trs1 arranged in the X direction in FIG. 1 are commonly connected by the selective gate lines SGL1. In the same way, the selective gate transistors Trs2 arranged in the X direction in FIG. 1 are commonly connected by the selective gate lines SGL2.

A bit line contact CB is connected to the drain region of the selective gate transistor Trs1. The bit line contact CB is connected to a bit line BL extending in the Y direction (serving as a bit line direction) perpendicular to the X direction in FIG. 1. Furthermore, each selective gate transistor Trs2 is connected via a source region to a source line SL extending in the X direction in FIG. 1.

Figure 2:
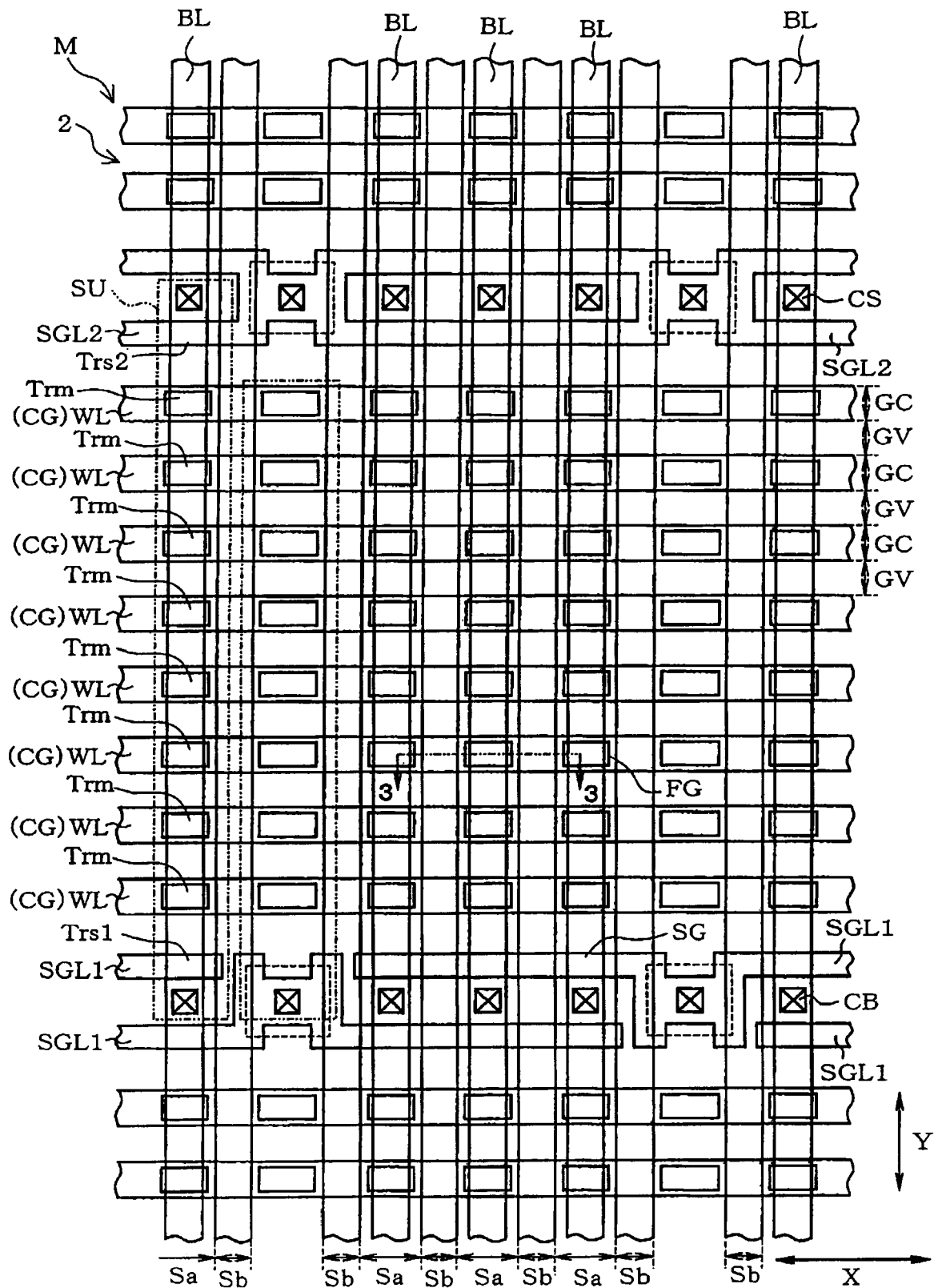
FIG. 2 is a plan view showing structure of part of the memory cell region.

FIG. 2 is a plan view showing a layout pattern of part of the memory cell region. A plurality of element isolation regions Sb each of which has a shallow trench isolation (STI) structure are formed in a p-type silicon substrate 2 so as to extend in the Y direction in FIG. 2. The element isolation regions Sb are formed in the X direction at predetermined intervals. As a result, a plurality of element regions (active regions) Sa are formed so as to be separated from each other in the X direction in FIG. 2.

Word lines WL of the memory cell transistors Trm are formed in the X direction perpendicular to the element regions Sa in FIG. 2. The word lines WL are constituted by connecting control gate electrodes CG of the memory cell transistors Trm and configured in gate electrode forming regions GC in FIG. 2. The word lines WL are formed so as to be spaced away from one another in the Y direction in FIG. 2. More specifically, the word lines WL are electrically separated from one another in the Y direction by interlayer insulating films buried in gate electrode separation regions GV.

Furthermore, the selective gate transistor Trs1 at the bit line contact CB side includes a pair of selective gate lines SGL1 formed in the X direction in FIG. 2 with a bit line contact CB being interposed therebetween. Bit line contacts CB are formed on the element region (active region) between the paired selective gate lines SGL1. Furthermore, the selective gate transistor Trs2 at the source line contact CS side includes a selective gate line SGL2 formed in the X direction in FIG. 2.

Floating gate electrodes FG of the memory cell transistors Trm are formed in regions where the word lines WL and the element regions Sa intersect with each other. The floating gate electrodes FG are aligned both in the X and Y directions. The word lines WL are formed over the plural element regions Sa and element isolation regions Sb so as to extend in the X direction in FIG. 2. The word lines WL are further formed over the floating gate electrodes FG aligned in the X direction. Furthermore, selective gate electrodes SG of the selective gate transistors Trs1 are formed in regions where the selective gate lines SG and the element regions Sa intersect with each other. The selective gate electrodes SG are connected to the selective gate lines SGL1 in the X direction.

Figure 3:
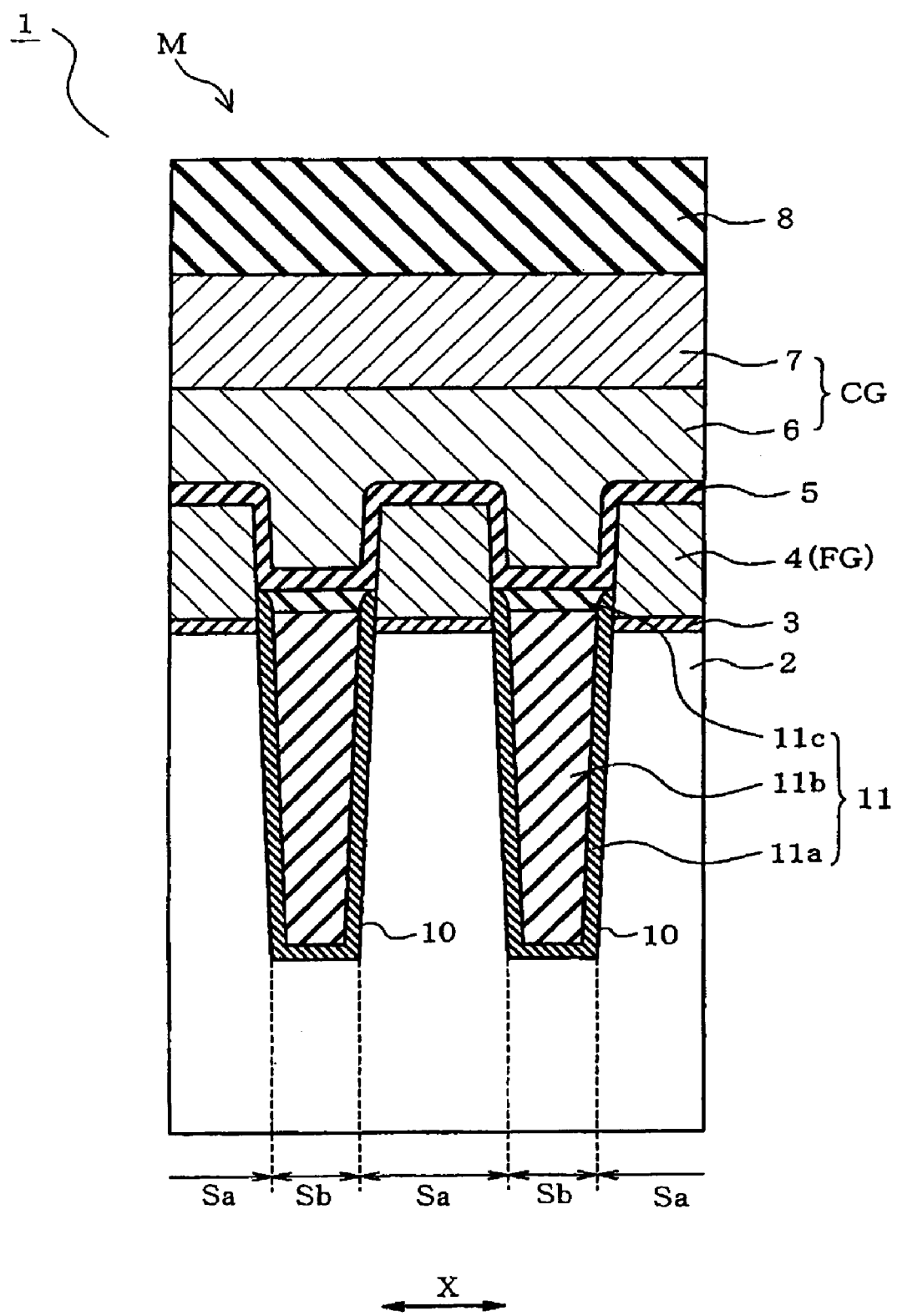
FIG. 3 is a sectional view taken along line 3-3 in FIG. 2.

FIG. 3 is a sectional view taken along line 3-3 in FIG. 2. The structure of the bit lines BL is eliminated in FIG. 3 since the bit lines have no direct relation with the embodiment. As shown in FIG. 3, the element isolation region Sb having a shallow trench isolation (STI) structure is provided in the silicon substrate 2 so as to divided the element region Sa. A gate insulating film 3 serving as a tunnel insulating film is formed on the element region Sa of the substrate 2. The gate insulating film 3 is comprised of, for example, a silicon oxide film.

The silicon substrate 2 includes a region located beneath the gate insulating film 3. The region is configured into a channel region of the memory cell transistor Trm. A polycrystalline silicon layer 4 is formed on the gate insulating film 3 of the element region Sa. The polycrystalline silicon film 4 is formed by depositing amorphous silicon and thereafter, thermally treated thereby to be polycrystallized. The polycrystalline silicon layer 4 is configured into a floating gate electrode (gate electrode layer).

Element isolation trenches 10 are formed in the element isolation region Sb. An element isolation insulating film 11 is buried in each elementisolation trench 10. More specifically, the element isolation insulating film 11 is buried in an upper surface layer of the silicon substrate 2 and has an upper surface protruding upward such that the upper surface is located higher than the upper surfaces of the substrate 2 and the gate insulating film 3 and lower than the upper surface of the polycrystalline silicon layer 4. The element isolation insulating film 11 has sidewalls which are formed so as to be coplanar with the sides of the polycrystalline silicon layer 4 and the gate insulating film 3.

Each element isolation film 11 is composed of a silicon oxide film 11a formed along an inner wall surface of each element isolation trench 10, a polysilazane film 11b formed along an inner surface of the silicon oxide film 11a and a silicon oxide film 11c formed inside the element isolation trench 10 of the silicon oxide film 11a and inside the silicon oxide film 11c. An intergate insulating film 5 is formed on the element isolation films 11 and the polycrystalline silicon layers 4. The intergate insulating film 5 is formed into a stacked film structure of an oxide film layer and a nitride film layer comprised of an oxide (silicon oxide film)-nitride (silicon nitride film)-oxide (silicon oxide film) (ONO) film, for example.

The intergate insulating film 5 is formed on the upper surfaces of the element isolation insulating films 11 and polycrystalline silicon film 4 and along sidewalls of the film 4 over a plurality of element regions Sa and a plurality of element isolation regions Sb. A polycrystalline silicon layer 6 is formed on the intergate insulating film 5. The polycrystalline silicon layer 6 is doped with impurities such as phosphorus and made from amorphous silicon, which is subsequently polycrystallized by a thermal treatment.

A low resistivity metal silicide layer 7 is formed on the polycrystalline silicon layer 6 by silicization of an upper part of the layer 6. The polycrystalline silicon layer 6 and low resistivity metal silicide layer 7 constitute a control gate electrode CG. A silicon nitride film 8 is formed on the low resistivity metal silicide layer 7.

A method of fabricating the memory cell region M will now be described with reference to FIGS. 4 to 16. One or more steps which will be described later may be eliminated. Furthermore, one or more general steps may be added to the fabrication method if necessitated. Additionally, the films may be made from other materials than those described herein. Furthermore, the film thickness of each film may be changed.

Figure 4:
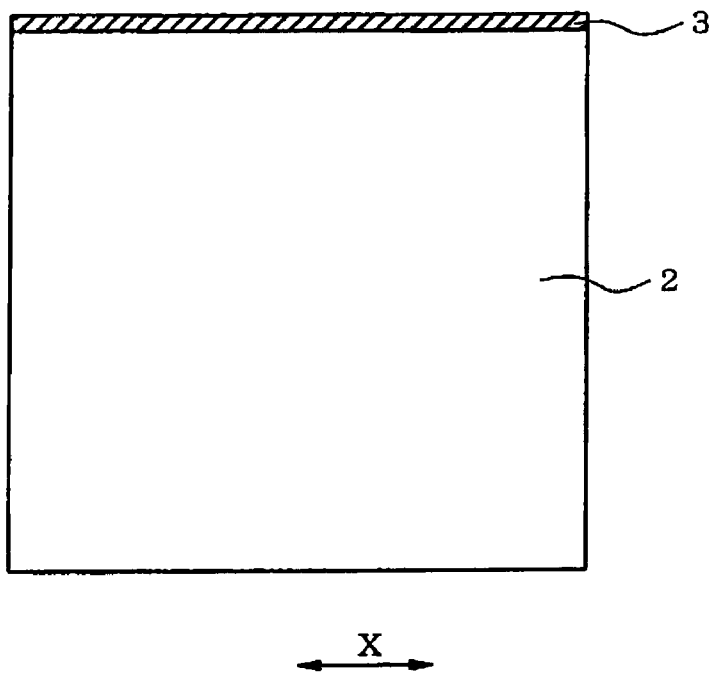
FIGS. 4 to 16 are sectional views taken along line 3-3 showing a frame format of part of the memory cell region during fabrication (Nos. 1 to 13)
Figure 5:
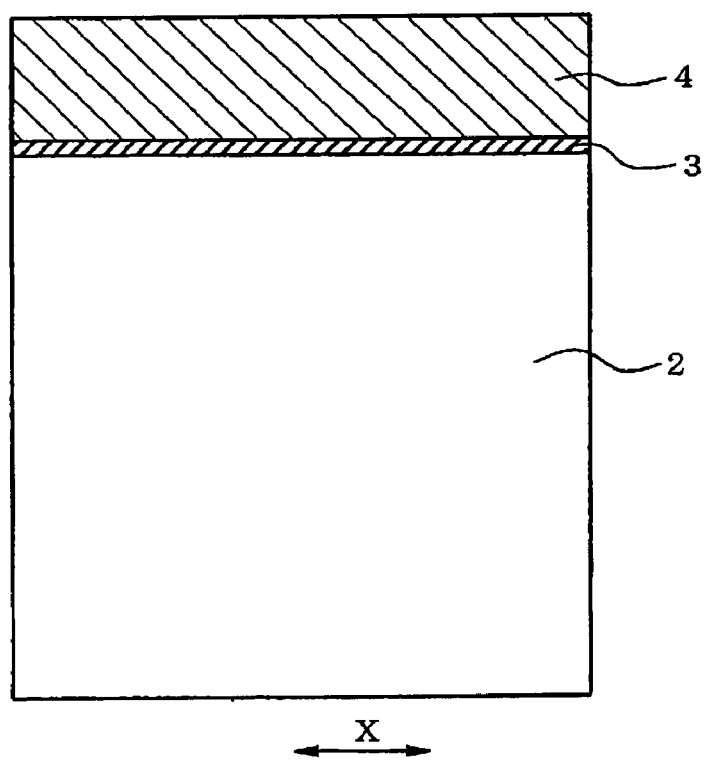
Figure 6:
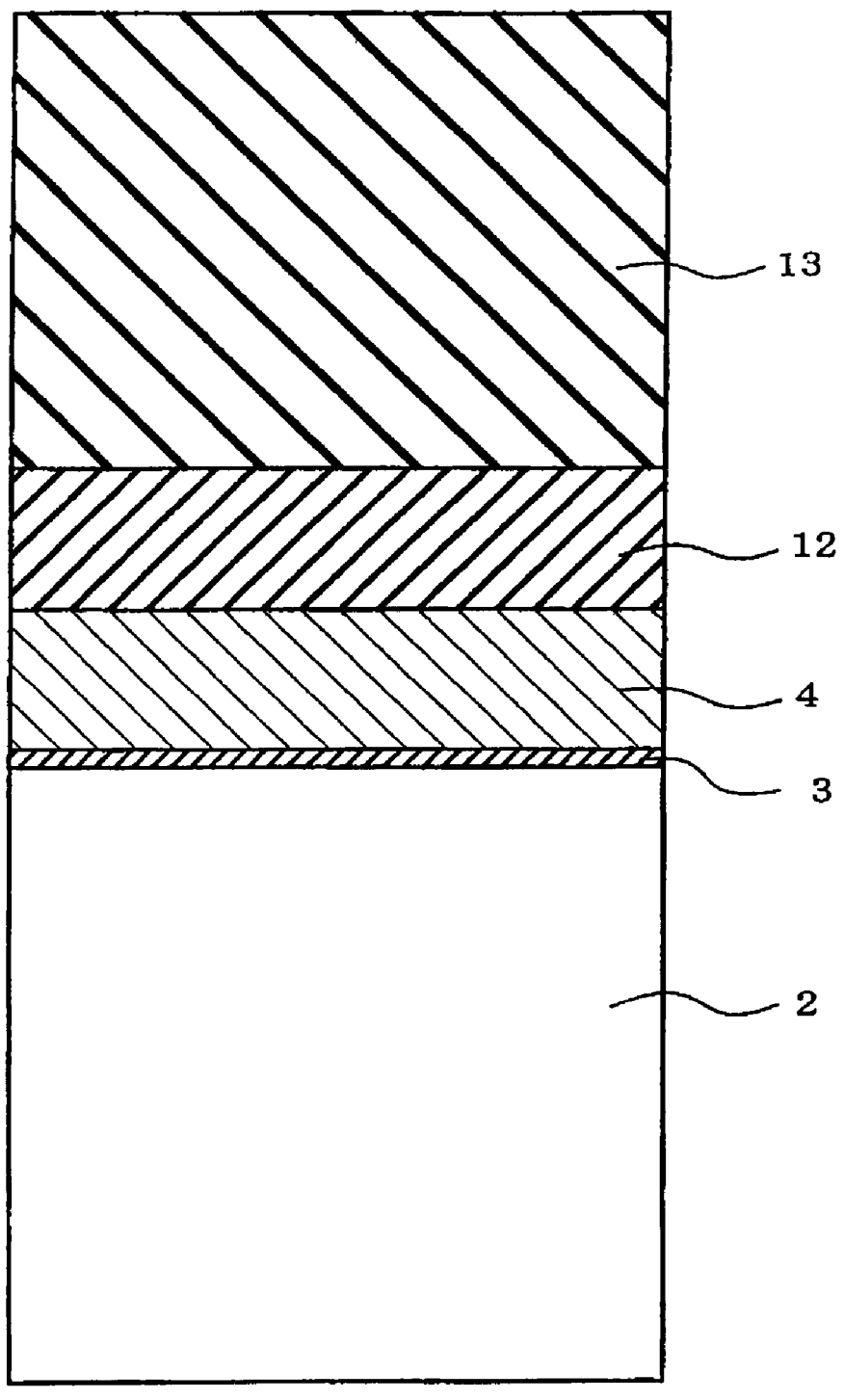

As shown in FIG. 4, a thin gate insulating film 3 having a film thickness of about 8 nm is formed on the silicon substrate 2. Subsequently, amorphous silicon doped with impurities is deposited on the gate insulating film 3 so as to have a film thickness of about 80 nm, as shown in FIG. 5. The amorphous silicon is changed by a subsequent thermal treatment into a polycrystalline silicon layer 4. Subsequently, a silicon nitride film 12 is deposited on the polycrystalline silicon layer 4 so as to have a film thickness of about 70 nm, and a silicon oxide film 13 having a film thickness of about 200 nm is deposited as a hard mask on the silicon nitride film 12 as shown in FIG. 6.

Figure 7:
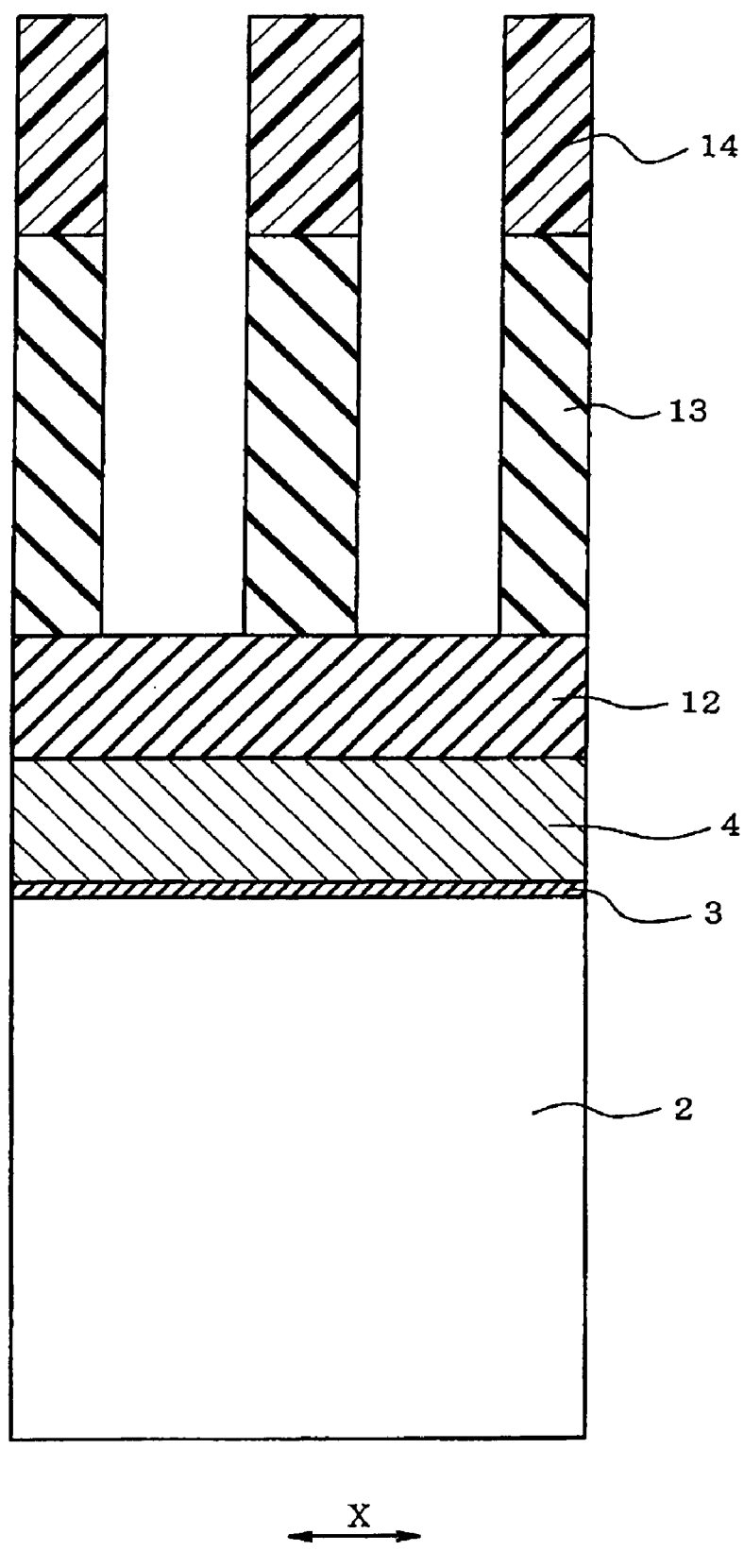
Figure 8:
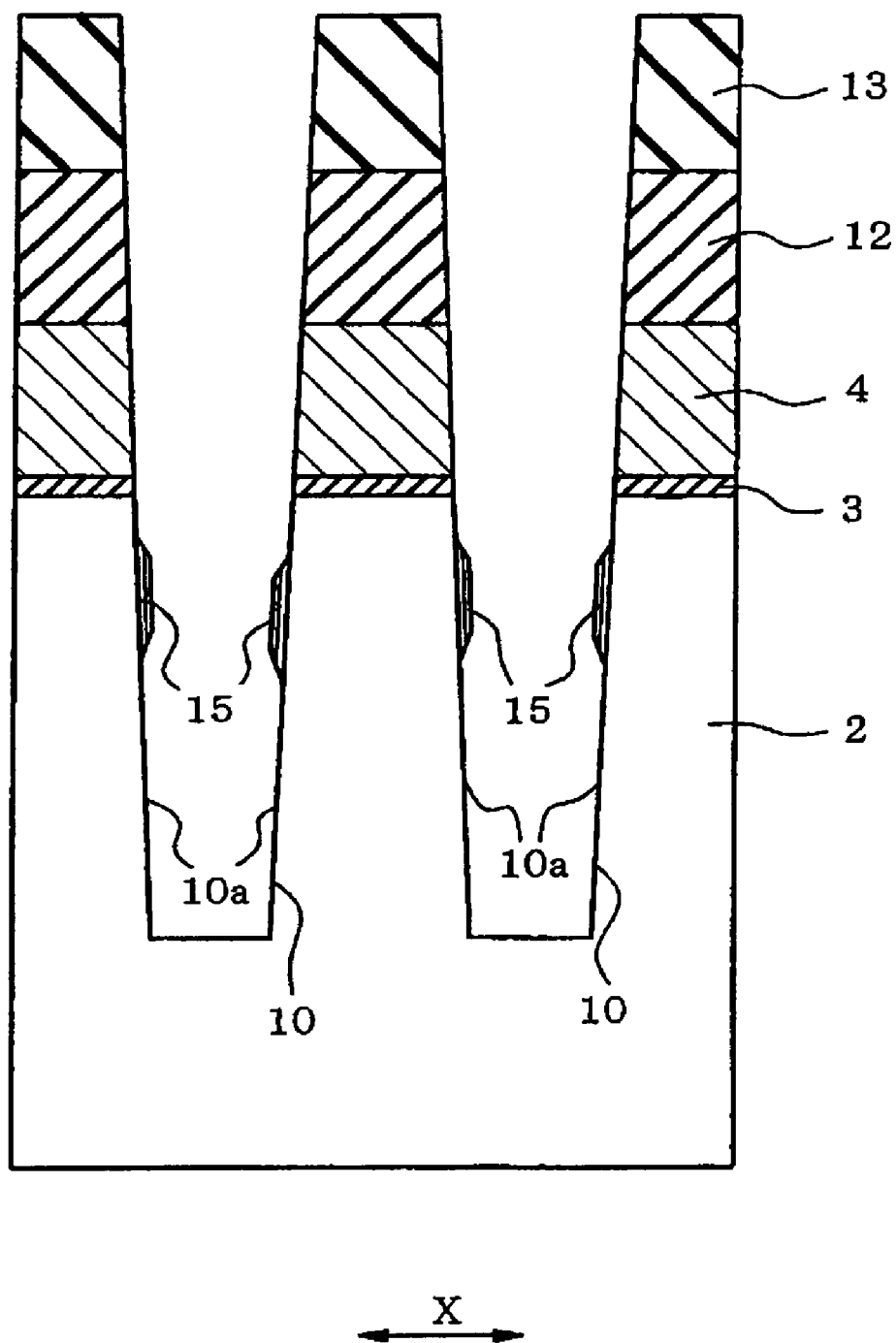

Subsequently, a resist 14 is coated on the silicon oxide film 13 and patterned into a desired shape by a lithography technique as shown in FIG. 7. The silicon oxide film 13 is anisotropically etched by a reactive ion etching (RIE) method with the patterned resist 14 serving as a mask. Subsequently, as shown in FIG. 8, the resist 14 is removed and the silicon nitride film 12, the polycrystalline silicon layer 4, the gate insulating film 3 and an upper portion of the silicon substrate 2 are anisotropically etched by the RIE method with the remaining silicon oxide film 13 serving as a mask, whereby each element isolation trench 10 is formed. In this case, reactive product due to the etching process was confirmed which was adherent to an inner surface (sidewall surface and bottom surface) 10a of each element isolation trench 10. The inventors found that a principal component of the reactive product was a stacked structure of a film component mainly comprising carbon (C) (hereinafter, "carbon film"), a silicon oxide film (SiOx) and a carbon-containing silicon oxide film (SiOxCy; and containing nitrogen and halogen).

In the embodiment, in order that the reactive product of the stacked structure may be removed, firstly, (1) the inner surface of trench 10 is etched about 1 nm by dilute hydrofluoric liquid (HF liquid diluted by adding water, for example, $H_2O$: HF=100:1) so that the carbon film and the silicon oxide film are removed, and (2) the interior of each trench 10 is treated with HF vapor phase cleaning (VPC) under the condition that the surface of the silicon substrate 2 is maintained at 70° C. or above, whereby the carbon-containing silicon oxide film which cannot be removed by treatment (1) is removed. As the result of execution of treatments (1) and (2), the reactive product can be removed from the element isolation trench 10 while occurrence of bird beak is prevented in the gate insulating film 3 by elimination of the thermal oxidation treatment and while anomalous diffusion of impurities is avoided.

Figure 9:
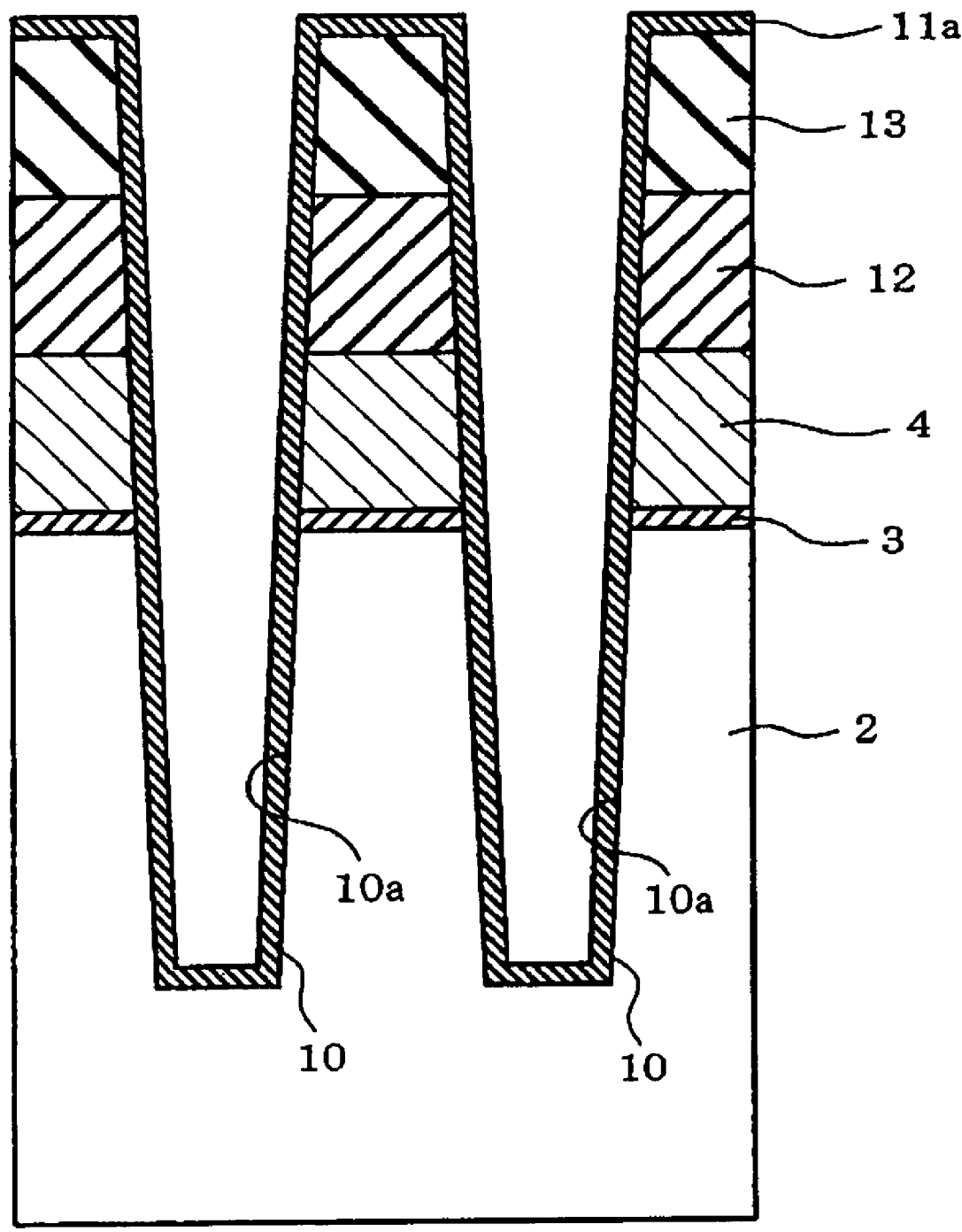

Subsequently, as shown in FIG. 9, a high temperature oxide (HTO) film or the silicon oxide film 11a is formed along the inner surface (sidewall surfaces and bottom surface) 10a of each element isolation trench 10 by a low pressure chemical vapor deposition (LPCVD) method using a mixed gas of dichlorosilane ($SiH_2Cl_2$) and dinitrogen monoxide ($N_2O$) at about 800° C.

Figure 10:
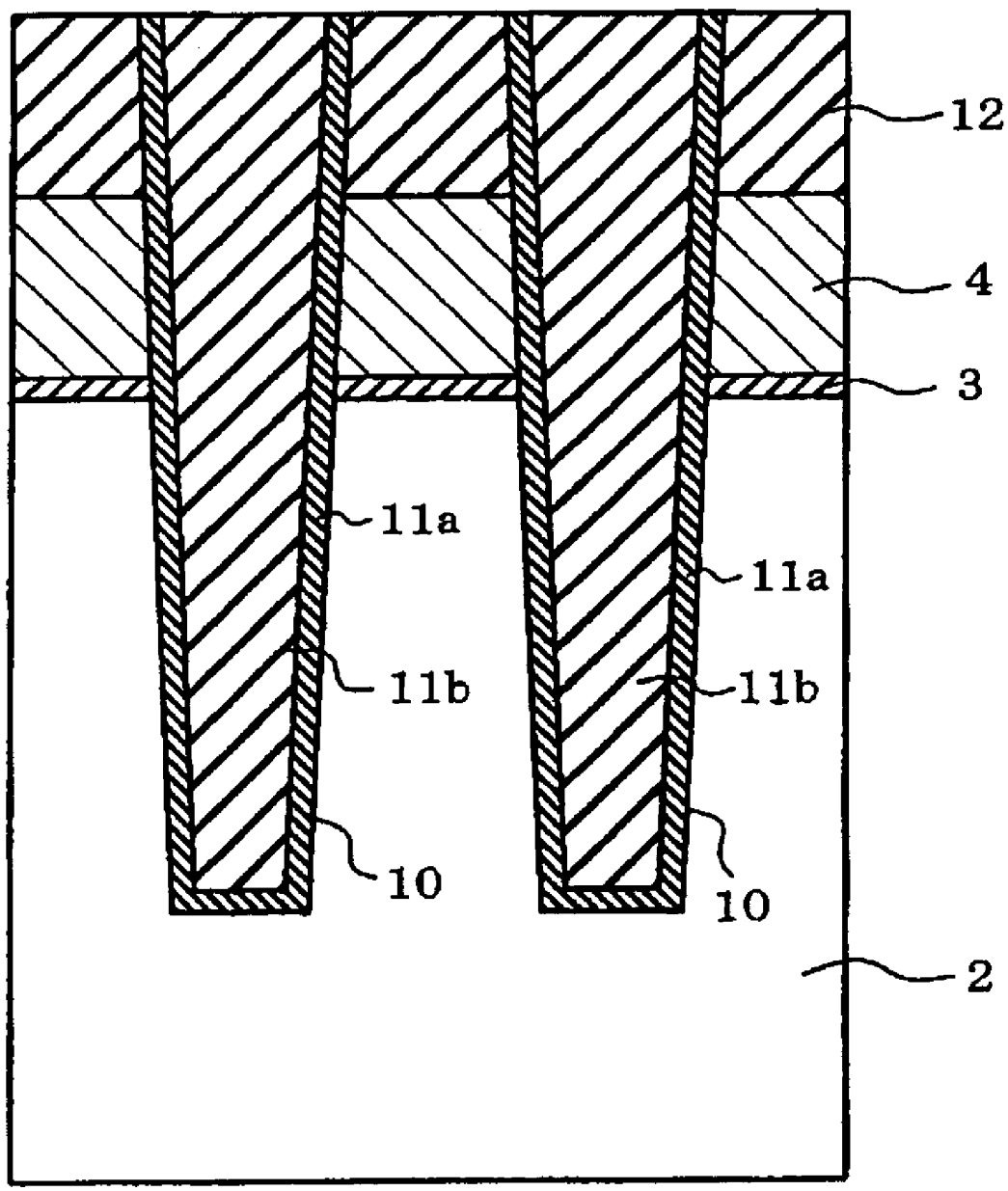
Figure 11:
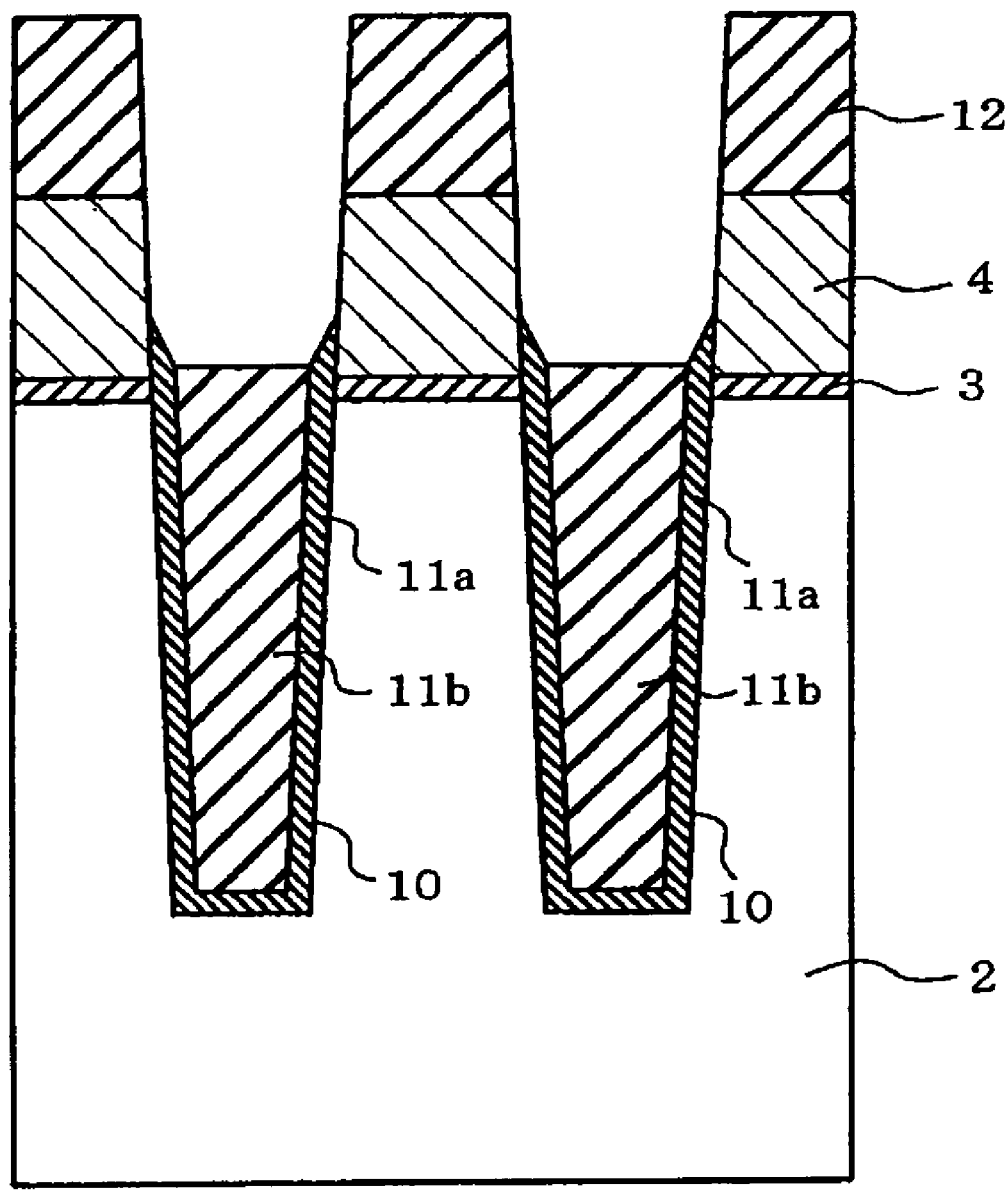

Subsequently, as shown in FIG. 10, a coating type insulating film (spin on glass, SOG) and polysilazane 11b serving as a coating type low-k interlayer insulating film are coated on the inner surface of each trench 10 in turn. Thereafter, the polysilazane 11b is heated in an oxidizing atmosphere so as to be sintered and planarized by a chemical mechanical polishing (CMP) method with the silicon nitride film 12 serving as a stopper. Subsequently, as shown in FIG. 11, polysilazane 11b is treated with the HF liquid diluted by adding water so as to be removed such that an upper surface of the polysilazane 11b is located higher than the upper surface of the silicon substrate 2 and lower than an upper surface of the polycrystalline silicon layer 4. In this case, one part of the silicon oxide film 11a is simultaneously removed but the other part of the film 11a remains along a lower sidewall of the polycrystalline silicon layer 4 and the sidewall of the gate insulating film 3.

Figure 12:
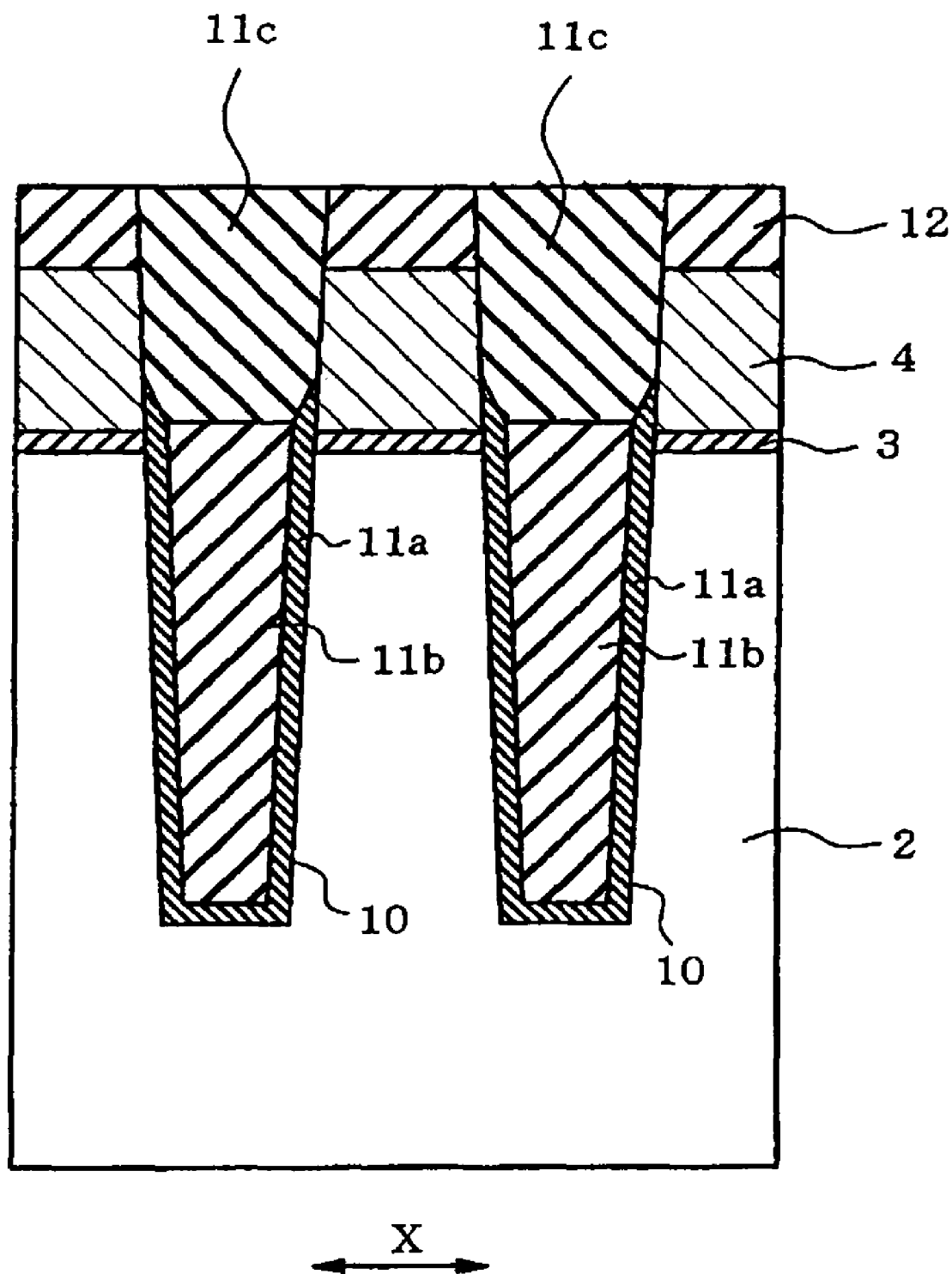
Figure 13:
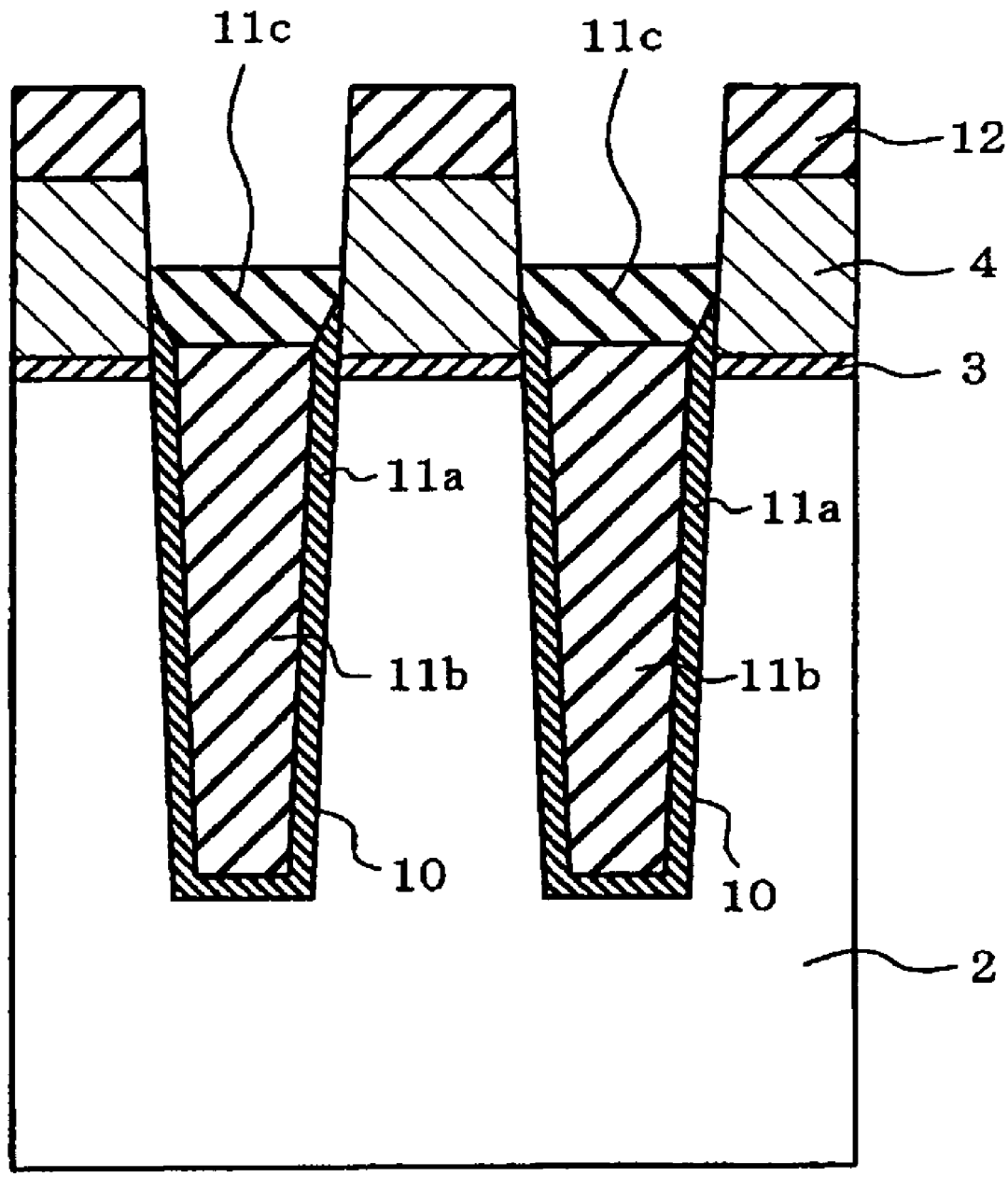

Subsequently, as shown in FIG. 12, the silicon oxide film 11c is deposited on the polysilazane 11b by a high density plasma CVD (HDPCVD) method and planarized by the CMP method with the silicon nitride film 12 serving as a stopper so as to be substantially coplanar with the upper surface of the silicon nitride film 12. Subsequently, as shown in FIG. 13, the silicon oxide film 11c is anisotropically etched by the RIE method under the condition that the anisotropic etching has a higher selectivity for the silicon nitride film 12, so that the upper surface of the silicon oxide film 11c located lower than the upper surface of the polycrystalline silicon layer 4 and higher than the upper surface of the gate insulating film 3.

Figure 14:
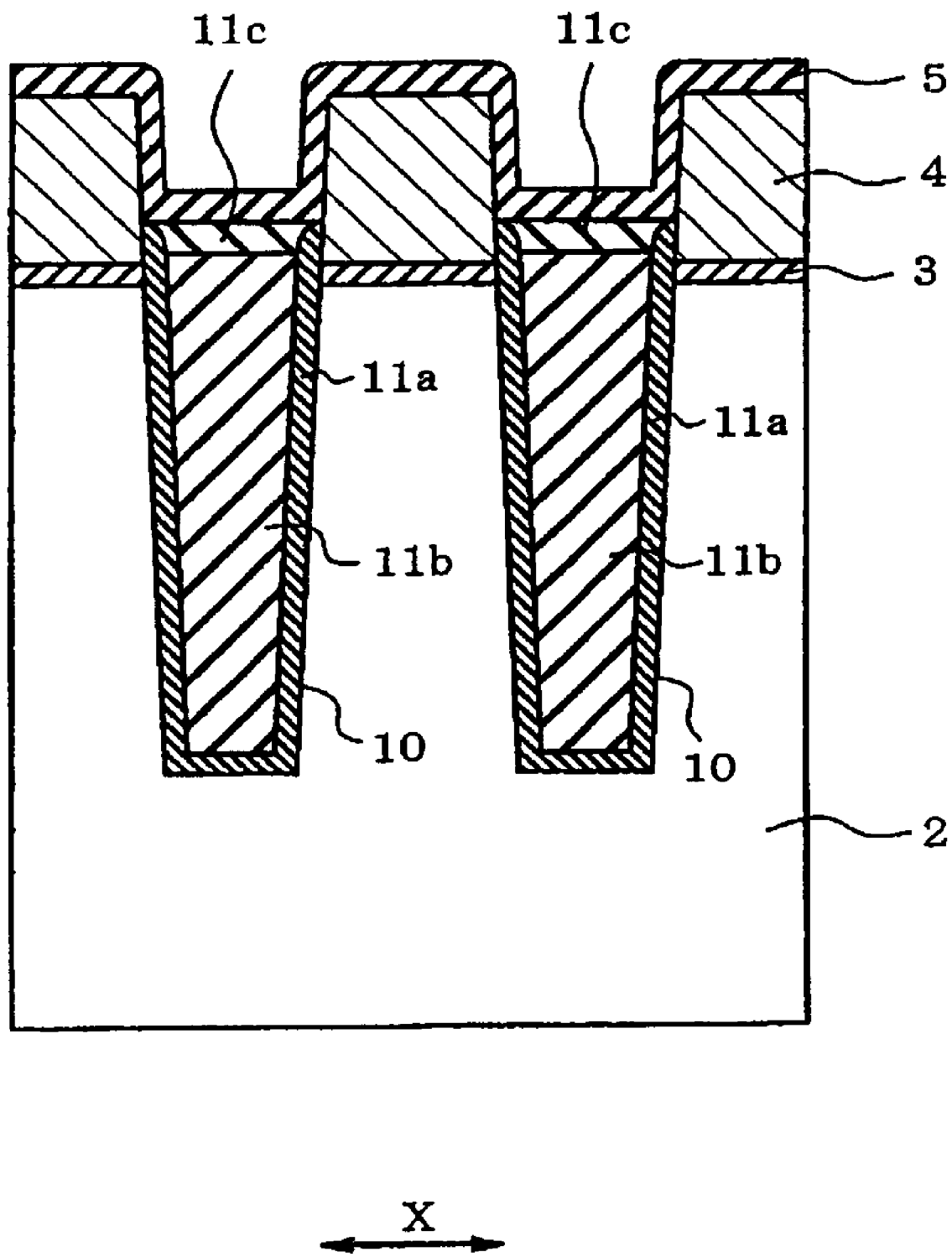
Figure 15:
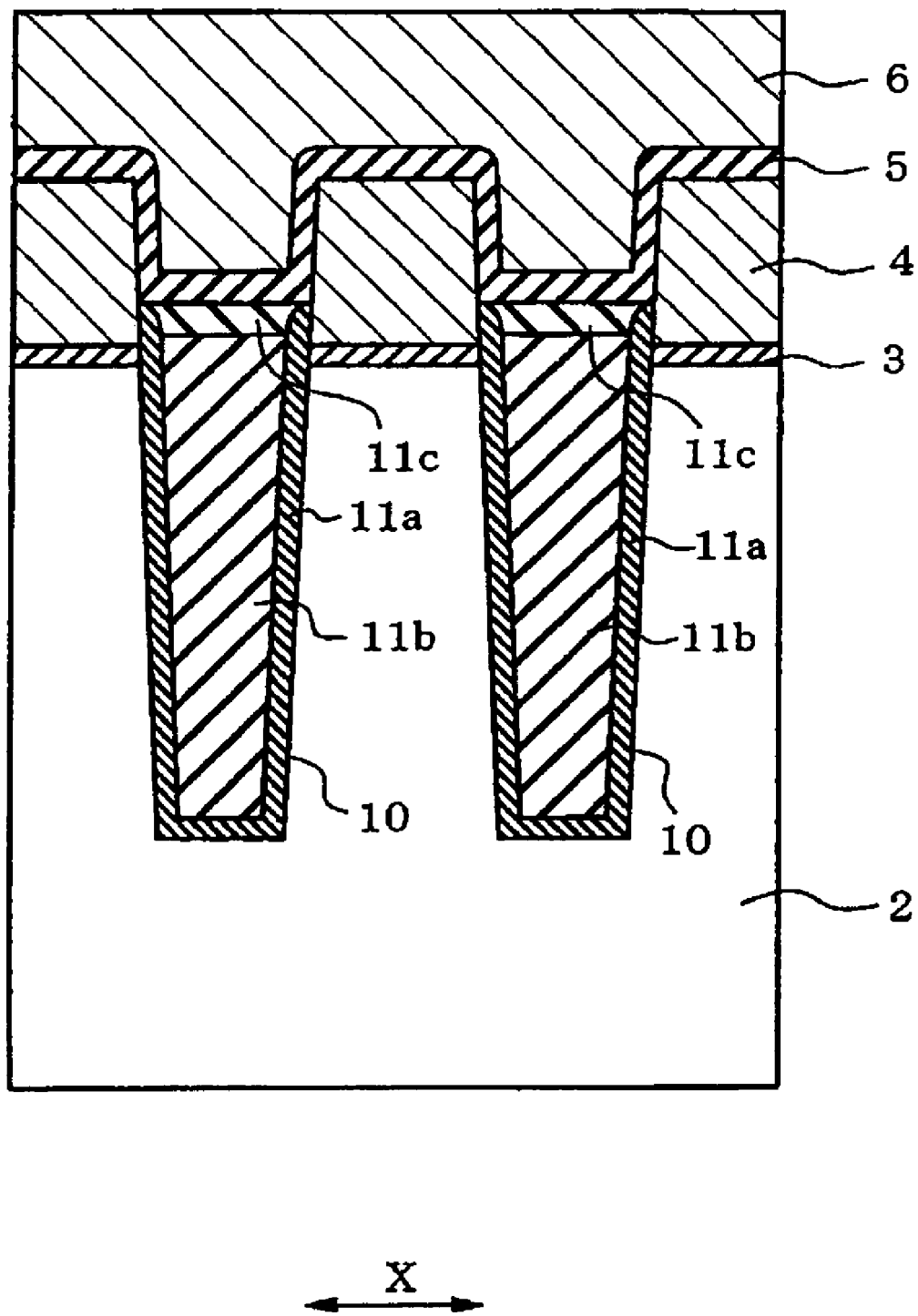
Figure 16:
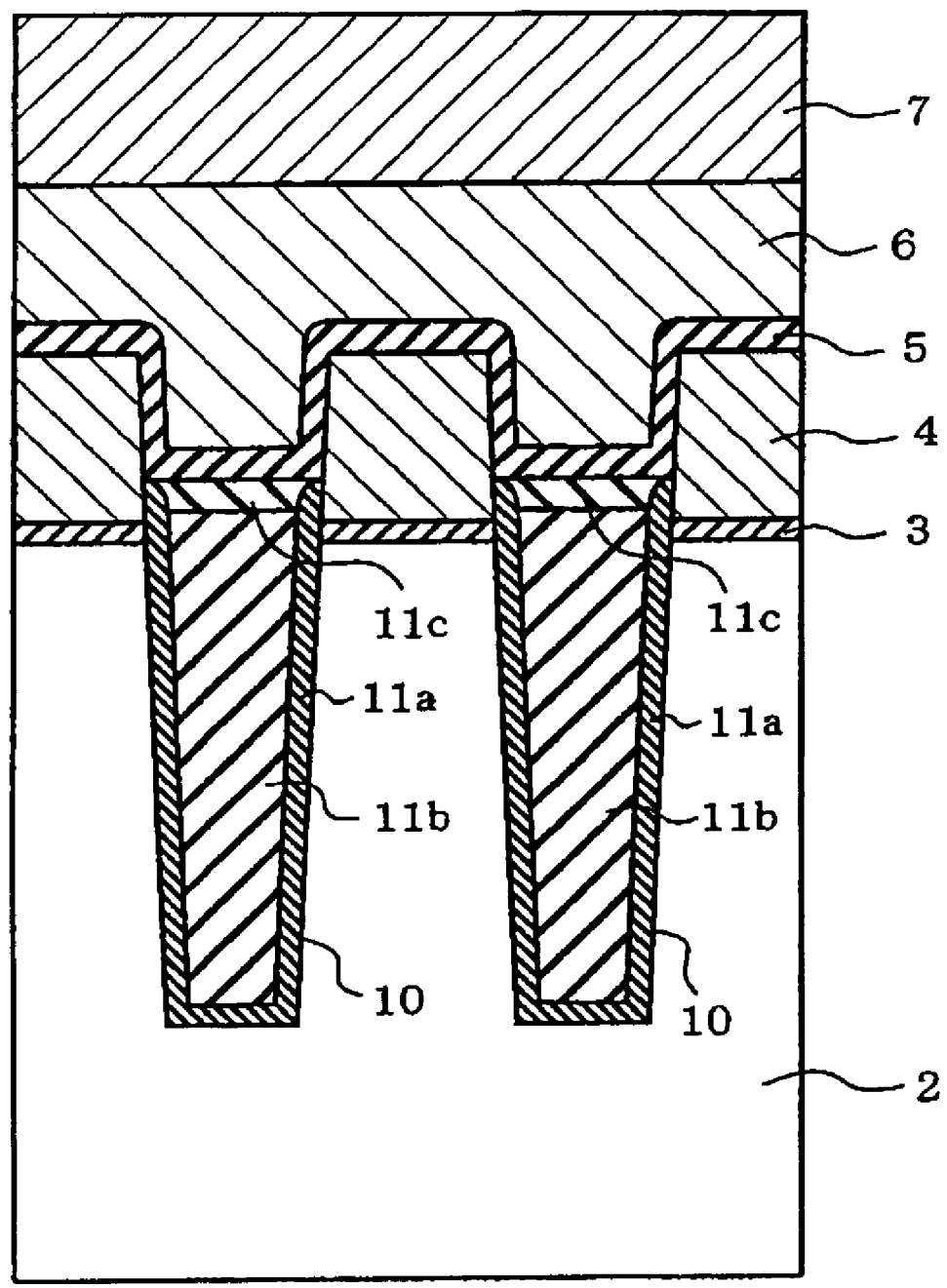

Subsequently, as shown in FIG. 14, the silicon nitride film 12 is removed and the intergate insulating film 5 is formed by the LPCVD method. The intergate insulating film 5 has a stacked structure of an oxide film such as an ONO film and a nitride film. Subsequently, as shown in FIG. 15, amorphous silicon doped with impurities is deposited on the intergate insulating film 5. The amorphous silicon is changed by a subsequent thermal treatment into the polycrystalline silicon layer 6. Subsequently, as shown in FIG. 16, the low resistivity metal silicide layer 7 is formed on the polycrystalline silicon layer 6. Next, the silicon nitride film 8 is formed on the metal silicide layer 7 as shown in FIG. 3. Thereafter, the layers 4 to 8 are divided in the Y direction. However, since the step has almost no relation with the embodiment, the description thereof will be eliminated.

Figure 17:
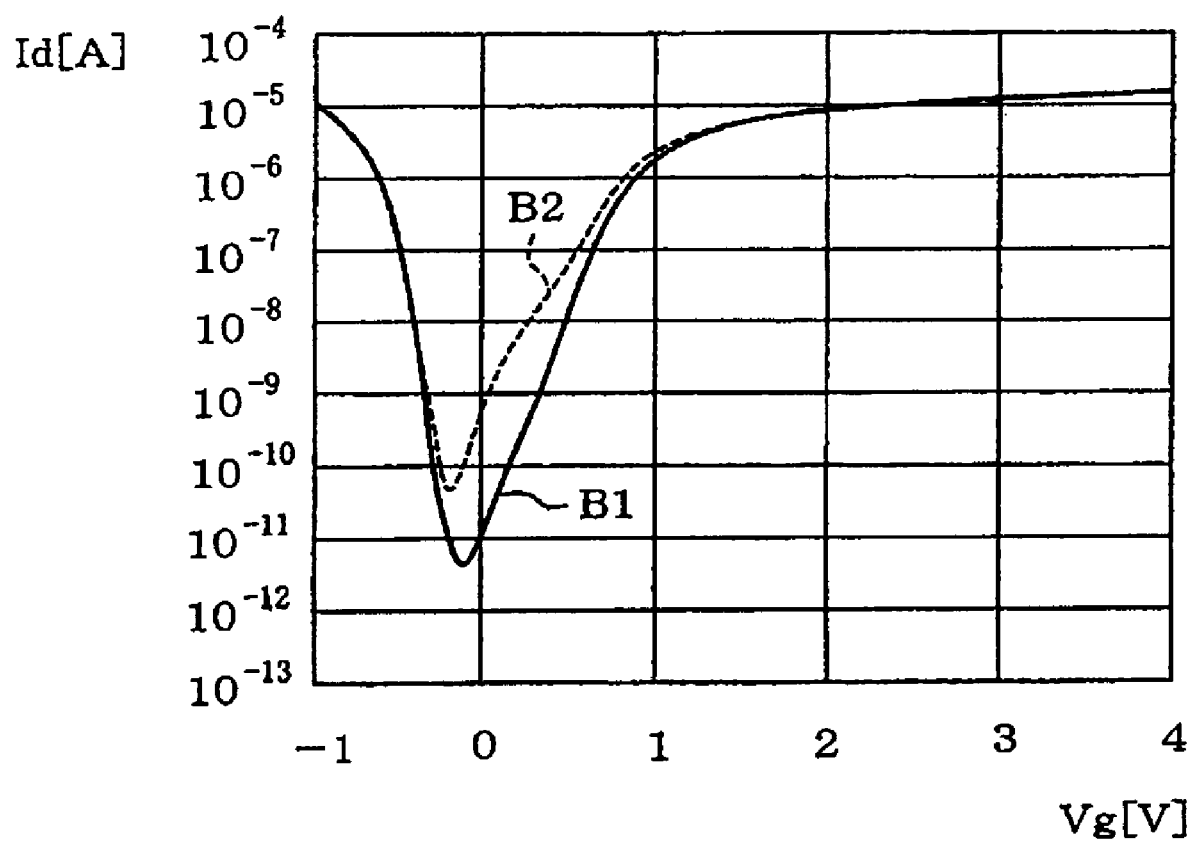
FIG. 17 is a graph showing comparison of transistor characteristics.

FIG. 17 is a graph showing the comparison between a conventional fabricating method and the fabricating method of the embodiment in the drain current Id-gate voltage Vg characteristic of the transistor configured in the peripheral circuit region. Characteristic B1 denotes the characteristic in the case where the fabricating method of the embodiment is applied, whereas characteristic B2 denotes the case where the conventional fabricating method is applied. As obvious from FIG. 17, it is confirmed that the current Id can be suppressed when Vg=0.

In the above-described embodiment, the gate insulating film 3 is formed on the silicon substrate 2. The polycrystalline silicon layer 4 is then formed on the gate insulating film 3. The silicon nitride film 12 is then formed on the polycrystalline silicon layer 4. The silicon oxide film 13 is formed on the silicon nitride film 12. The resist 14 is coated on the silicon oxide film 3 and patterned. The trench is formed in the silicon oxide film 13 with the resist 14 serving as the mask and thereafter, the element isolation trench 10 is formed in the silicon nitride film 12, the gate insulating film 3 and the upper part of the silicon substrate 2 with the silicon oxide film 13 serving as a mask.

The reactive product 15 of the etching process carried out along the inner surface 10a of each element isolation trench 10 remains in a plurality of layers during formation of the trench. However, the reactive product 15 is treated with the diluted hydrofluoric acid and thereafter further treated by the HF vapor phase cleaning (HFVPC) . As a result, the reactive product 15 in the plural layers can be removed without high temperature thermal treatment.

The invention should not be limited by the foregoing embodiment. The embodiment may be modified or expanded as follows. Although the invention has been applied to the NAND flash memory device 1 in the foregoing embodiment, the invention may be applied to another type of flash memory with storage. Furthermore, the invention may be applied to semiconductor devices with a stacked gate electrode structure of two or more layers.

Although the invention has been applied to the semiconductor device including the silicon substrate 2 as the semiconductor substrate in the foregoing embodiment, the semiconductor device may include a semiconductor plate of another material.

Although the invention has been applied to the semiconductor device including the gate insulating film 3 comprised of the silicon oxide film in the foregoing embodiment, the insulating film may be made from another material.

Although the floating gate electrode FG is comprised of the polycrystalline silicon layer 4 in the foregoing embodiment, the electrode FG may be a conductive film made from another material.

The intergate insulating film 5 may comprise another insulating film with a stacked structure of oxidation films and nitride films such as NONON (silicon nitride film-silicon oxide film-silicon nitride film-silicon oxide film-silicon nitride film).

Although the dilution rate is 100:1 in the above-described step (1), the dilution rate which is larger than 100:1 (for example, 200:1) may be applied to the HP liquid. In this case, an amount of etching is equal to or smaller than 1.5 nm.

Furthermore, an ashing process with use of $O_2$ plasma may be provided between the above-described steps (1) and (2). In this case, carbon contained in the carbon-containing silicon oxide film of the reactive product is oxidized into an oxide film. Thereafter, the oxide film and remaining silicon oxide film are removed by the hydrofluoric vapor phase treatment.

Additionally, the above-described steps (1) and (2) may be carried out after the ashing process. Furthermore, the above-described step (1) may be carried out after the ashing process and step (2) may be eliminated. In this case, carbon is oxidized by the ashing process thereby to be formed into an oxide film. The oxide film and silicon oxide film are removed by the diluted hydrofluoric treatment.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
   forming a trench in a semiconductor substrate by a reactive ion etching (RIE) method with a reactive product of film stack of a carbon film/silicon oxide film/carbon-containing silicon oxide film, the trench having an inner surface; and
   removing the reactive product, by:
      treating the trench with diluted hydrofluoric acid to remove the carbon film and the silicon oxide film followed by
      treating the film by a hydrofluoric acid vapor phase cleaning (HFVPC) method to remove the carbon-containing silicon oxide film.

2. The method according to claim 1, wherein a dilution rate is $H_2O:HF=100:1$ or above during said treating the trench with dilute hydrofluoric acid.

3. The method according to claim 1, wherein a surface of the semiconductor substrate is at a temperature of 70° C. or greater during said treating the trench by a hydrofluoric acid vapor phase cleaning (HFVPC) method.

4. The method according to claim 1, further comprising forming a high temperature oxide (HTO) film along the inner surface of the trench occurs at temperature of about 800° C.

5. The method according to claim 4, wherein said forming a high temperature oxide (HTO) film along the inner surface of the trench comprises utilizing a mixture comprising dichlorosilane and dinitrogen monoxide gases.

6. The method according to claim 1, further comprising:
   forming a high temperature oxide (HTO) film along the inner surface of the trench; and
   forming an element isolation insulating film inside the HTO film in the trench so that the trench is filled with the element isolation insulating film.

7. The method according to claim 6, further comprising depositing a thin gate insulating film on said semiconductor substrate; and
   depositing a gate insulating film on said thin gate insulating film.

8. The method according to claim 7, wherein said thin gate insulating film has a thickness of about 8 nm; and said gate insulating film has a thickness of about 80 nm.

9. The method according to claim 7, further comprising contacting said element isolation insulating film with a dilute HF solution to remove a portion of said element isolation insulating film so that an upper surface of said element isolation film is located higher than an upper surface of said silicon substrate and lower than an upper surface of said gate insulating film.

10. The method according to claim 7, further comprising depositing a silicon oxide film on said gate insulating film;
    forming an intergate insulating film on said silicon oxide film by a LPCVD method;
    forming a layer of amorphous silicon doped with impurities on said intergate insulating film; and
    depositing a metal silicide layer on said layer of amorphous silicon doped with impurities.

11. The method according to claim 1, further comprising ashing the trench between said treating the trench with diluted hydrofluoric acid and said treating the trench by a hydrofluoric acid vapor phase cleaning.

12. The method according to claim 1, further comprising ashing the trench between said forming a trench and said treating the trench with diluted hydrofluoric acid.

13. The method according to claim 11, wherein said ashing further comprises contacting said trench with a plasma of $O_2$.

14. The method according to claim 12, wherein said ashing further comprises contacting said trench with a plasma of $O_2$.

15. The method according to claim 1, wherein a dilution rate is $H_2O:HF=200:1$ or above during said treating the trench with dilute hydrofluoric acid.

16. The method according to claim 1, wherein a dilution rate is from $H_2O:HF=100:1$ to $H_2O:HF=200:1$ during said treating the trench with dilute hydrofluoric acid.

* * * * *